(12) United States Patent
Tang et al.

(10) Patent No.: US 10,826,273 B2
(45) Date of Patent: Nov. 3, 2020

(54) NARROW LINEWIDTH SEMICONDUCTOR LASER BASED ON SINGLE-WAVELENGTH NARROWBAND OPTICAL FILTERING ASSEMBLY FREQUENCY SELECTION

(71) Applicant: Accelink Technologies Co., Ltd., Wuhan (CN)

(72) Inventors: Yi Tang, Wuhan (CN); Yujia Zhai, Wuhan (CN); We Ke, Wuhan (CN); Yizong Chen, Wuhan (CN)

(73) Assignee: Accelink Technologies Co., Ltd. (CN)

( * ) Notice: Subject to any disclaimer, the term of this patent is extended or adjusted under 35 U.S.C. 154(b) by 16 days.

(21) Appl. No.: 16/329,088

(22) PCT Filed: Mar. 30, 2017

(86) PCT No.: PCT/CN2017/078720
§ 371 (c)(1),
(2) Date: Jun. 17, 2019

(87) PCT Pub. No.: WO2018/040555
PCT Pub. Date: Mar. 8, 2018

(65) Prior Publication Data
US 2019/0312409 A1 Oct. 10, 2019

(30) Foreign Application Priority Data
Aug. 29, 2016 (CN) .......................... 2016 1 0754820

(51) Int. Cl.
*H01S 3/08* (2006.01)
*H01S 5/14* (2006.01)
(Continued)

(52) U.S. Cl.
CPC .............. *H01S 5/14* (2013.01); *H01S 5/0078* (2013.01); *H01S 5/0654* (2013.01);
(Continued)

(58) Field of Classification Search
CPC .......... H01S 5/14; H01S 5/065; H01S 5/0687; H01S 5/141; H01S 5/0087; H01S 5/4062; H01S 5/5054; H01S 5/0654
See application file for complete search history.

(56) References Cited

U.S. PATENT DOCUMENTS 6,115,401 A * 9/2000 Scobey ............... H01S 3/08036
372/100
6,526,071 B1 * 2/2003 Zorabedian ............. H01S 5/141
372/102
(Continued)

FOREIGN PATENT DOCUMENTS

CN 1839523 A 9/2006
CN 101295855 A 10/2008
(Continued)

OTHER PUBLICATIONS

International Search Report PCT/CN2017/078720, dated Jun. 28, 2017.

*Primary Examiner* — Kinam Park
(74) *Attorney, Agent, or Firm* — Lerner, David, Littenberg, Krumholz & Mentlik, LLP

(57) ABSTRACT

A narrow linewidth external cavity semiconductor laser comprises semiconductor optical amplifier chip, comb-shaped optical filter, bandpass optical filter, partial reflection sheet, and collimated light beam coupling output assembly Collimated light beam coupling output assembly is composed of isolator, coupling lens, and output optical fiber. Laser resonant cavity is formed by partial reflection sheet and rear end face of semiconductor optical amplifier chip. Comb-shaped optical filter and bandpass optical filter form single-channel narrowband optical filtering assembly. Bandwidth enables laser to perform single-mode lasing and effectively restrain any other mode lasing. Longitudinal mode's relative position over whole filtering band may be (Continued)

controlled by adjusting laser temperature. Output wavelength and laser power are controlled and in best working state. Etalon is used as comb-shaped optical filter to easily realize narrow linewidth output. Commercial DWDM optical filter is used as bandpass optical filter to improve device wavelength flexibility and reduce costs.

9 Claims, 5 Drawing Sheets

(51) Int. Cl.
 *H01S 5/0687* (2006.01)
 *H01S 5/065* (2006.01)
 *H01S 5/00* (2006.01)
 *H01S 5/40* (2006.01)
 *H01S 5/50* (2006.01)

(52) U.S. Cl.
 CPC .......... *H01S 5/0687* (2013.01); *H01S 5/141* (2013.01); *H01S 5/4062* (2013.01); *H01S 5/5054* (2013.01)

(56) References Cited

U.S. PATENT DOCUMENTS

| | | | |
|---|---|---|---|
| 6,944,194 B1* | 9/2005 | Hatori | H01S 5/141 372/21 |
| 2003/0179790 A1 | 9/2003 | Bouda et al. | |
| 2004/0258360 A1* | 12/2004 | Lim | H01S 5/141 385/43 |
| 2005/0105565 A1* | 5/2005 | Tobiason | H01S 5/141 372/20 |
| 2005/0249509 A1* | 11/2005 | Nagarajan | H01S 5/024 398/198 |
| 2007/0211772 A1 | 9/2007 | Romano et al. | |
| 2007/0223552 A1* | 9/2007 | Muendel | H01S 5/141 372/50.12 |
| 2010/0020841 A1* | 1/2010 | Heine | H01S 5/141 372/92 |
| 2014/0050234 A1* | 2/2014 | Ter-Mikirtychev | H01S 3/0092 372/6 |
| 2015/0222090 A1* | 8/2015 | Piazza | H01S 5/141 372/20 |
| 2015/0311669 A1 | 10/2015 | Chuang et al. | |
| 2017/0187163 A1* | 6/2017 | Tang | H01S 5/50 |

FOREIGN PATENT DOCUMENTS

| | | |
|---|---|---|
| CN | 201398012 Y | 2/2010 |
| CN | 102709811 A | 10/2012 |
| CN | 102751656 A | 10/2012 |
| CN | 104508921 A | 4/2015 |
| CN | 104821485 A | 8/2015 |
| CN | 106207749 A | 12/2016 |

* cited by examiner

NARROW LINEWIDTH SEMICONDUCTOR LASER BASED ON SINGLE-WAVELENGTH NARROWBAND OPTICAL FILTERING ASSEMBLY FREQUENCY SELECTION

CROSS REFERENCE TO RELATED APPLICATIONS

The present application is a national phase entry under 35 U.S.C. § 371 of International Application PCT/CN2017/078720 filed Mar. 30, 2017, published in China, which claims priority from CN2016/10754820.9 filed Aug. 29, 2016, all of which are incorporated herein by reference.

TECHNICAL FIELD OF THE DISCLOSURE

The present disclosure relates to a laser element, and more particularly, to a principle and structure of a narrow linewidth semiconductor laser based on single-wavelength narrowband optical filtering assembly frequency selection. Specifically, the present disclosure relates to a structure and working principle of a narrow linewidth semiconductor external cavity laser using a comb-shaped optical filter and a bandpass optical filter as frequency selective elements. The narrow linewidth semiconductor laser may be used for a coherent optical communication system and an optical fiber sensing system. The present disclosure belongs to the field of communication and sensing techniques.

BACKGROUND

Narrow linewidth semiconductor lasers are widely used in the fields of optical fiber communication, optical fiber sensing, optical fiber remote sensing and material technology due to their advantages of narrow linewidth and low noise. A wavelength selection device may be used to determine and adjust its wavelength, limit a number of longitudinal modes being started to oscillate in a gain spectrum to enable lasers of a few frequencies meeting certain conditions to start oscillation, in order to narrow a linewidth; if only one longitudinal mode is allowed to be oscillated, a single-frequency laser is constituted, whose output light has extremely high temporal coherence and high practical value.

Generally speaking, narrow linewidth semiconductor lasers mostly adopt an external cavity frequency selection solution, in which narrow linewidth single frequency output of the laser is achieved by a manner of narrowband filter frequency selection and long cavity long narrowing linewidth. There are several embodiments as follows:

One of the embodiments is to use a Bragg waveguide grating as a wavelength selection device, for example, the U.S. Pat. No. 8,885,677B1 "Semiconductor external cavity laser with integrated planar waveguide bragg grating and wide-bandwidth frequency modulation", however, this method has a high difficult process and a greater coupling insertion loss.

Another embodiment is to use a fiber Bragg grating as a wavelength selection device, for example, the U.S. Pat. No. 8,018,982B2 "Sliced fiber bragg grating used as external cavity for semiconductor laser and solid state laser", however, such kind of laser structure puts forward high requirements on the packaging method of the fiber Bragg grating, and the grating is easily affected by environmental factors, which is not conducive to stable working of a laser.

Another embodiment is to use a volume Bragg grating as an external cavity frequency selective element of a laser, which has the advantage of convenient coupling, and the grating material is relatively firm and uniform, but it is difficult to make a bandwidth to be narrow and it is very expensive, thus it is not suitable for production. A similar example is the U.S. Pat. No. 9,287,681B2 "Wavelength Stabilized Diode Laser," which describes how to use a volume Bragg grating plus an etalon for frequency selection to achieve a single mode output.

SUMMARY

An object of the present disclosure is to overcome the problems existed in the prior art, and to achieve a stable narrow linewidth laser output from a laser by using a semiconductor external cavity and using a combination filter of a comb-shaped optical filter and a bandpass optical filter as a frequency selective element.

The present disclosure provides a narrow linewidth external cavity semiconductor laser comprising a semiconductor optical amplifier chip, a single-wavelength narrowband optical filtering assembly, a reflection mirror, and a collimated light beam coupling output assembly;

the semiconductor optical amplifier chip, as a gain medium, providing a sufficient gain so as to achieve laser output;

the reflection mirror and one end face of the semiconductor optical amplifier chip forming two cavity mirrors of a laser resonant cavity;

the single-wavelength narrowband optical filtering assembly being disposed between the two cavity mirrors, which enables the laser to perform single mode lasing and effectively restrain any other mode lasing.

In the above technical solution, the single-wavelength narrowband optical filtering assembly comprises a comb-shaped optical filter and a bandpass optical filter.

In the above technical solution, the collimated light beam coupling output assembly comprises an isolator, a coupling lens and an output optical fiber.

In the above technical solution, the comb-shaped optical filter is an etalon, or a microring, or any other element which may produce an effect of the comb-shaped optical filter, and the bandpass optical filter is a DWDM optical filter, or an AWG, or an optical filter which may produce an effect of a bandpass optical filter.

In the above technical solution, the reflector is a partial reflection mirror, and the single-wavelength narrowband optical filtering assembly, the partial reflection mirror and the collimated light beam coupling output assembly are located on the same side of the semiconductor optical amplifier chip and are connected in sequence.

In the above technical solution, a front end face of the semiconductor optical amplifier chip is plated with an anti-reflection film, and a rear end face is plated with a high-reflection film; an optical signal output by the semiconductor optical amplifier chip enters the comb-shaped optical filter after collimated to form a comb-shaped optical filtering spectrum, and passes through the bandpass filter to select an optical signal with a desired wavelength, then, a portion of light is reflected, by the partial reflection mirror, back to the semiconductor optical amplifier to form a laser feedback resonance, while the other portion of light is transmitted and output from the partial reflection mirror, and forms an output laser beam via the isolator, the coupling lens and the output optical fiber.

In the above technical solution, the reflector is a total reflection mirror, and the single-wavelength narrowband optical filtering assembly and the total reflection mirror as well as the collimated light beam coupling output assembly are located on different side of the semiconductor optical amplifier chip, respectively.

In the above technical solution, a rear end face of the semiconductor optical amplifier chip is plated with an anti-reflective film, and the front end face is plated with a partial reflection film; an optical signal output by the semiconductor optical amplifier chip enters the comb-shaped optical filter after collimated to form a comb-shaped optical filtering spectrum, and passes through the bandpass optical filter to select an optical signal with a desired wavelength, then, reflected, by the total reflection mirror, back to the semiconductor optical amplifier to form a laser feedback resonance, while the other portion of light is transmitted and output from the front end face of the semiconductor optical amplifier chip, and enters the isolator, the coupling lens and the output optical fiber after collimated to form an output laser.

In the above technical solution, the semiconductor optical amplifier chip, the single-wavelength narrowband optical filtering assembly, the reflection mirror, and the collimated light beam coupling output assembly are carried on a rigid plate, and the rigid plate also has a temperature control system.

In the above technical solution, the relative position of a longitudinal mode over the whole filtering band is controlled by adjusting temperature of the laser through the temperature control system, so that an output wavelength and output power of the laser are controlled and the laser is in the best working state.

The present disclosure achieved the following technical effects:

1. The present disclosure uses a free-space optical path and has advantages of convenient coupling and simple structure.

2. The present disclosure uses a comb-shaped optical filter as a frequency selective element, which is easy to realize narrow linewidth output.

3. The present disclosure uses a commercial bandpass optical filter as a wavelength roughing selection element, which improves the wavelength flexibility of the device and reduces costs.

REFERENCE SIGNS

1—semiconductor optical amplifier chip
1A—rear end face
1B—front end face
2—collimating lens
3—etalon
4—bandpass optical filter
5—partial reflection mirror
6—isolator
7—coupling lens
8—output optical fiber
9—external cavity collimator lens
10—total reflection mirror

DESCRIPTION OF EMBODIMENTS

In order to facilitate the understanding and implementation of the present disclosure by those skilled in the art, the present disclosure will be further described in detail below with reference to drawings and embodiments.

The present disclosure provides a narrow linewidth external cavity semiconductor laser structure based on a volume Bragg grating, which uses a combination of a comb-shaped optical filter and a bandpass optical filter as a narrowband optical filter, and uses a structure of a semiconductor external cavity laser to achieve a narrow linewidth single frequency output, wherein the comb-shaped optical filter may be an etalon, or a microring, or any other element which may produce an effect of the comb-shaped optical filtering, and the bandpass optical filter may be a DWDM optical filter or an AWG or a type of element which may produce an effect of the bandpass optical filter. Next, the working principle of the present disclosure will be explained by taking an etalon and a DWDM optical filter as examples.

Figure 1:
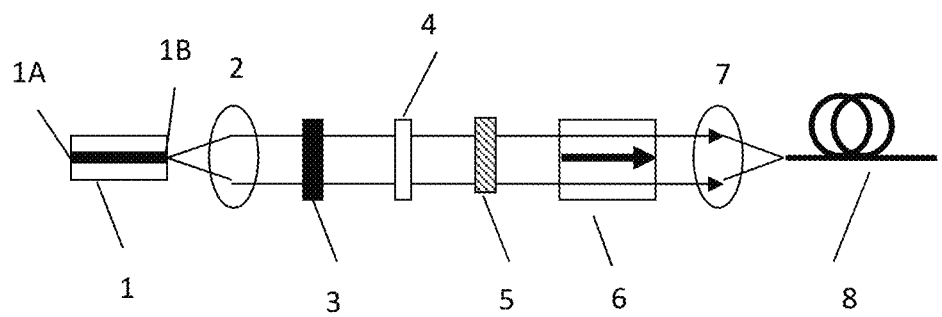
FIG. 1 is a schematic diagram of an optical path of a narrow linewidth laser based on frequency selection by an etalon according to the present disclosure.

The present disclosure provides a narrow linewidth external cavity semiconductor laser structure based on a single-wavelength narrowband optical filtering assembly, and one of its embodiments is shown in FIG. 1. As illustrated, the semiconductor laser comprises a semiconductor optical amplifier chip 1, a collimating lens 2, an etalon 3, a DWDM optical filter 4, a partial reflection mirror 5, an isolator 6, a coupling lens 7, and an output optical fiber 8, and the above devices are sequentially arranged. A front end face 1B of the semiconductor optical amplifier chip 1 is plated with an antireflection film, and a rear end face 1A is plated with a high-reflection film, both end faces of the etalon 3 are plated with a partial reflection film; the DWDM optical filter 4 generally uses a DWDM optical filter in a communication band to increase the flexibility of the output wavelength of the laser; the reflectivity of the partial reflection mirror 5 may have different selections; the isolator 6 generally uses a two-stage isolator, which may effectively prevent reflecting light from entering the laser resonant cavity; and the coupling lens 7 and the output optical fiber 8 form a coupling output system of the whole laser. An optical signal output by the semiconductor optical amplifier chip 1 enters the etalon 3 after collimated by the collimating lens 2 to form a comb-shaped light filtering spectrum, and passes through the bandpass optical filter 4 to select an optical signal with a desired wavelength, then, a portion of light reflected by the partial reflection mirror 5 back to the semiconductor optical amplifier 1 to form a laser feedback resonance, while the other portion of light is transmitted and output from the partial reflection mirror 5, and forms an output laser via the isolator 6, the coupling lens 7 and the output optical fiber 8. The isolator 6, the coupling lens 7 and the output optical fiber 8 take effect of coupling and outputting the collimated light beam.

The above whole optical system may be packaged in a standard butterfly package of 14PIN or a smaller TOSA package, generally speaking, the above optical system will be carried by a whole rigid plate which should have good thermal conductivity and low coefficient of thermal expansion, such as a copper plate or ceramic plate etc. Generally speaking, a thermal electrical cooler (TEC) will be installed under the rigid plate carrying the optical system, and a thermistor is placed on the rigid plate to form a temperature control system with the TEC, ensuring the stable working of the laser.

The functions of the core components in the above embodiments of the present disclosure are as follows:

The semiconductor optical amplifier chip 1 provides a sufficient gain for the laser as a gain medium so as to achieve laser output. The rear end face 1A is plated with a high-reflection film and may be used as a rear reflection surface of the laser resonant cavity, and the front end face 1B is plated with an antireflective film, which may reduce a FP effect of the die itself as much as possible. The semiconductor optical amplifier chip 1 is designed to have a low dispersion gain to control the laser side mode so as to achieve a purpose of reducing noise in the resonant cavity. Further, the semiconductor optical amplifier chip 1 is designed as a light extraction with a P polarization state and a high extinction ratio to ensure a pure laser mode.

The etalon 3 and the DWDM optical filter 4 are combined to form a single-wavelength narrowband optical filtering assembly, wherein two end faces of the etalon 3 are respectively plated with partial reflection films, and in the case of normal incidence, it can be seen from transmitting formulas 1-1 and 1-2 of the etalon $$\delta\gamma = \frac{c}{2nd} \quad \quad 1\text{-}1$$

$$\Delta\gamma = 4\arcsin\left[\frac{(1-R)}{2\sqrt{R}}\right] \quad \quad 1\text{-}2$$

that the free spectral range δγ is correlated with a material retractive index n and a thickness d of the etalon 3, and the bandwidth Δγ of a transmission peak is correlated with the reflectivity of the partial reflection films on the two end faces, and the higher the reflectivity, the narrower the bandwidth of the transmission peak and the higher the contrast, the narrow bandwidth and the high contrast are conducive to suppress the side mode and reduce the noise inside the cavity, therefore, when designing the etalon 3, the reflectivity of the two end faces will generally be made higher.

Figure 2:
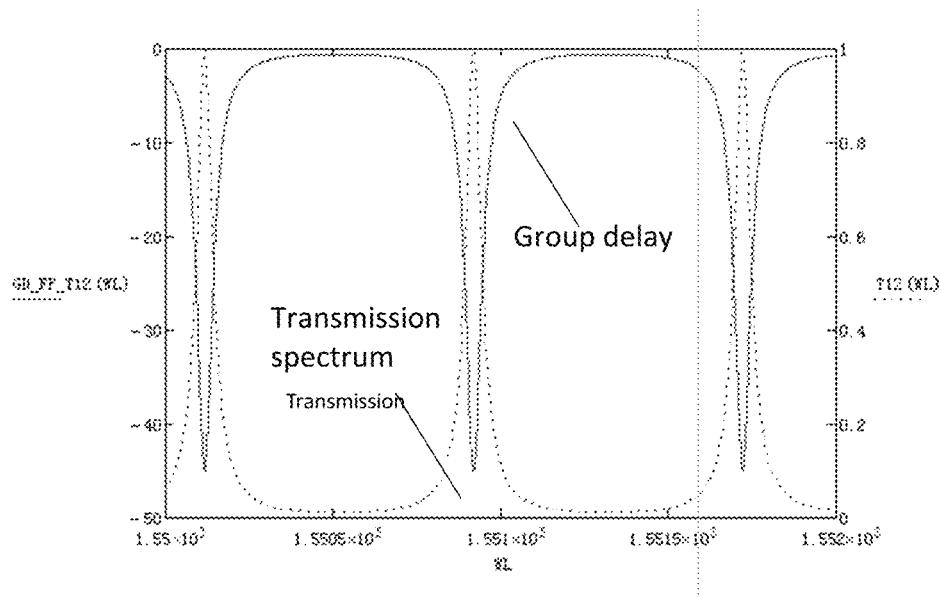
FIG. 2 is a graph of etalon transmission spectrums and group delays.

The transmission spectrum of the etalon 3 is shown in FIG. 2. In the transmission peak of the etalon 3, a narrow linewidth output is more easily obtained at a position with a relatively large group delay, because the effective optical path at this time is large, and the group delay curve of the etalon 3 is shown in FIG. 2.

Figure 3:
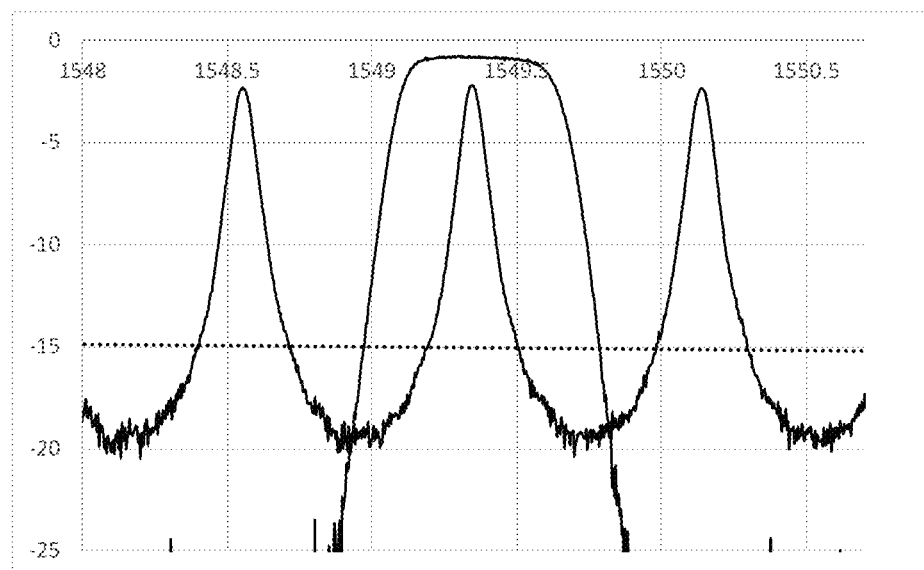
FIG. 3 is a diagram showing a relative relationship between an etalon transmission spectrum and a bandpass filter transmission spectrum.

The transmission spectrum of the DWDM optical filter 4 in the present disclosure may be selected from a Gaussian type or a flat-topped type, but its transmission peak must be aligned with the selected transmission peak of the etalon 3, moreover, other transmission peaks of the etalon 3 cannot appear within the 20 dB bandwidth of the DWDM optical filter 4, which requires reasonable selection of the free spectral range of the etalon 3 and the 20 dB bandwidth of the bandpass optical filter 4. Further, considering that the temperature sensitivity of the etalon 3 is generally higher than that of the DWDM optical filter 4, therefore, in order to ensure the insertion loss of the whole filtering system, the flat-topped type of the DWDM optical filter 4 is generally selected. The relationship between filtering bands of the two elements can be seen in FIG. 3. The etalon 3 is designed with an appropriate bandwidth and a free spectral range, and the DWDM optical filter 4 is designed as a flat-topped type or Gaussian type of filtering band shape, both of which are combined to form a single-channel narrowband optical filtering assembly, wherein the bandwidth thereof is sufficient to enable the laser to perform single-mode lasing and to effectively restrain any other mode lasing.

The partial reflection mirror 5 and the rear end face 1A of the semiconductor optical amplifier chip 1 form two cavity mirrors of the laser resonant cavity, and an optical distance between the partial reflection mirror 5 and the rear end face 1A determines a longitudinal mode interval of the whole laser, the longer the optical distance, the shorter the longitudinal mode interval, and the narrower the linewidth of a single longitudinal mode, therefore, in designing the narrow linewidth laser, the distance between the two reflection surfaces should be appropriately increased. In addition, in order to achieve laser single longitudinal mode output, the bandwidth of the etalon 3 should contain as less longitudinal modulus as possible, which is conducive to suppress the laser side mode and reduce the laser noise, then it shows that if the distance between the two reflection surfaces is too long, on the contrary, it is not conducive to suppress the laser side mode, therefore, a balance is needed between the cavity length (i.e. the optical distance between the two reflecting surfaces, i.e. the partial reflection mirror 5 and the rear end face 1A of the semiconductor optical amplifier chip 1) of the laser and the bandwidth of the etalon 3 to enable the laser to work in an optimal state.

When a longitudinal mode in the filtering band of the etalon 3 is closest to the transmission peak to obtain a gain advantage, lasing can be performed, thereby forming laser output, while other adjacent longitudinal modes are suppressed due to mode competition and filtering band insertion loss. By changing the working temperature of the laser, the relative position of the lasing mode in the laser in the transmission spectrum of the etalon 3 may be controlled, thus affecting the output characteristics of the laser, further, it is also considered that the transmission peak of the etalon 3 and the longitudinal mode of the laser move in the same direction when the laser temperature changes, but the longitudinal mode of the laser moves faster.

Figure 4:
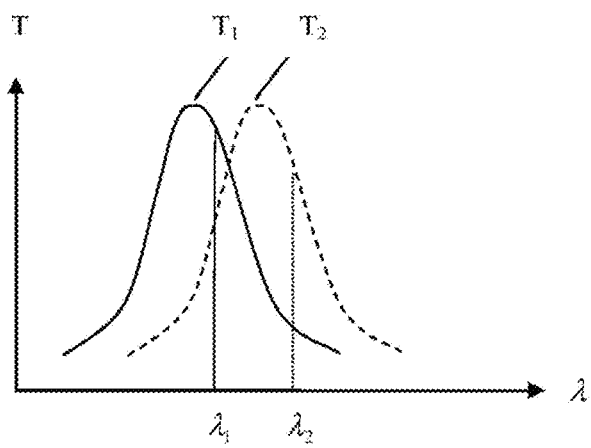
FIG. 4 shows an effect of temperature on an etalon transmission spectrum and a laser wavelength.
Figure 5:
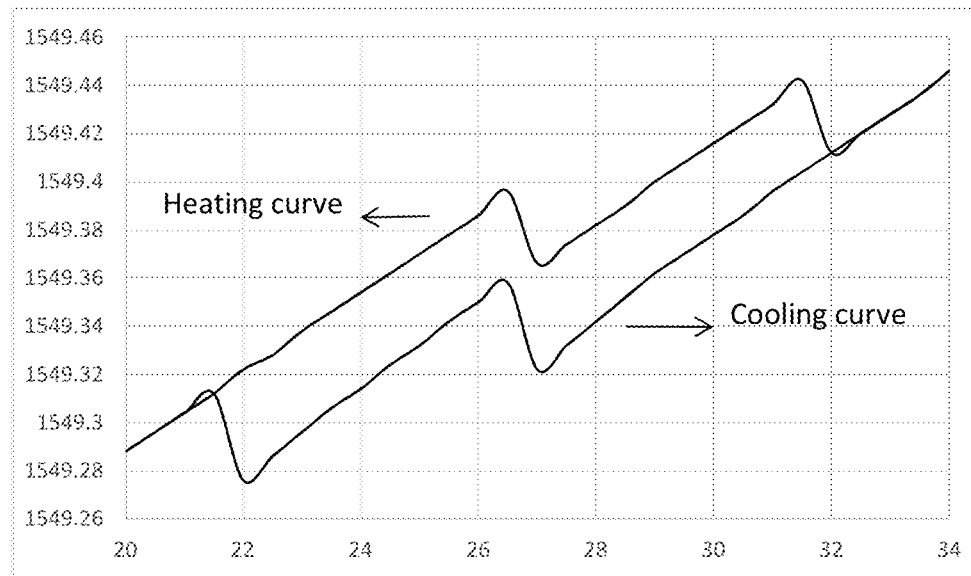
FIG. 5 shows a variation rule of a laser wavelength with temperature.
Figure 6:
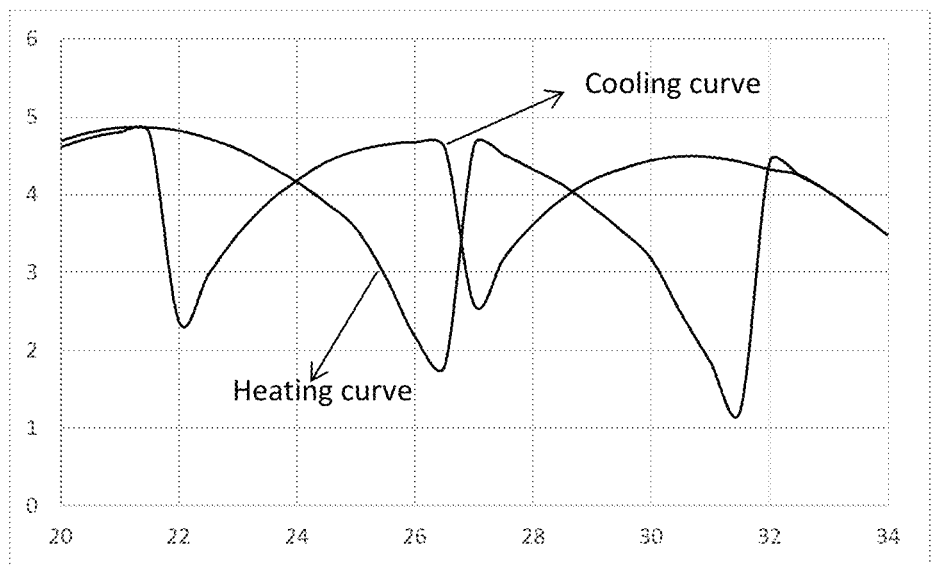
FIG. 6 shows a variation rule of laser power with temperature.

The solid line in FIG. 4 represents relative positions between the longitudinal mode at an initial wavelength λ1 and the transmission peak of the etalon 3 when the temperature of laser is T1, and the dashed line represents relative positions between the longitudinal mode moving to λ2 and the transmission peak of the etalon 3 when the temperature of laser is T2, which can be seen that if both of the wavelength and insertion loss of the longitudinal mode capable of lasing at two temperatures have changed, the final wavelength and power output by the laser will be led to be changed. FIG. 5 shows a wavelength variation rule corresponding to a heating process and a cooling process of the laser, and FIG. 6 shows a variation rule of the output power corresponding to a heating process and a cooling process of the laser. It can be seen from FIGS. 5 and 6 that the heating curve and the cooling curve are not completely coincident, which is due to the mode hopping hysteresis effect caused by the mode competition of the laser.

Thereby, the relative position of a longitudinal mode over the whole filtering band may be controlled by adjusting the temperature of the laser, so that the output wavelength and the output power of the laser are controlled to enable the laser be in the best working state.

Figure 7:
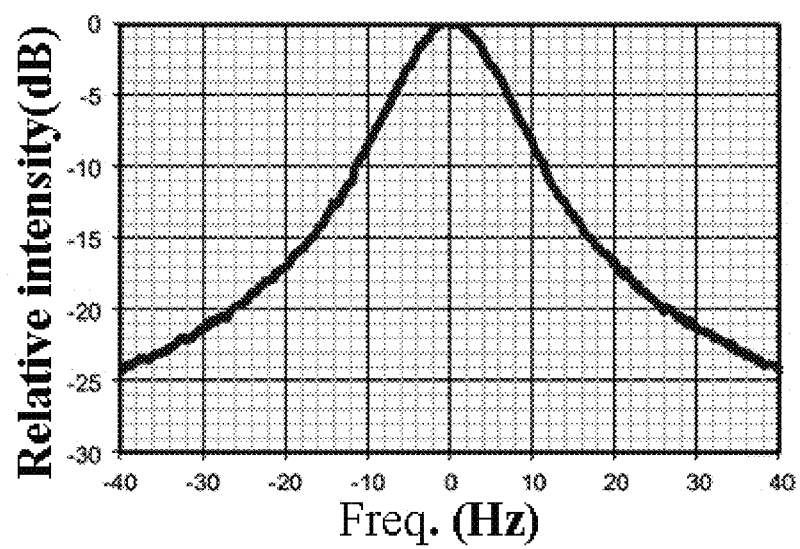
FIG. 7 is a diagram showing results of laser linewidth test.
Figure 8:
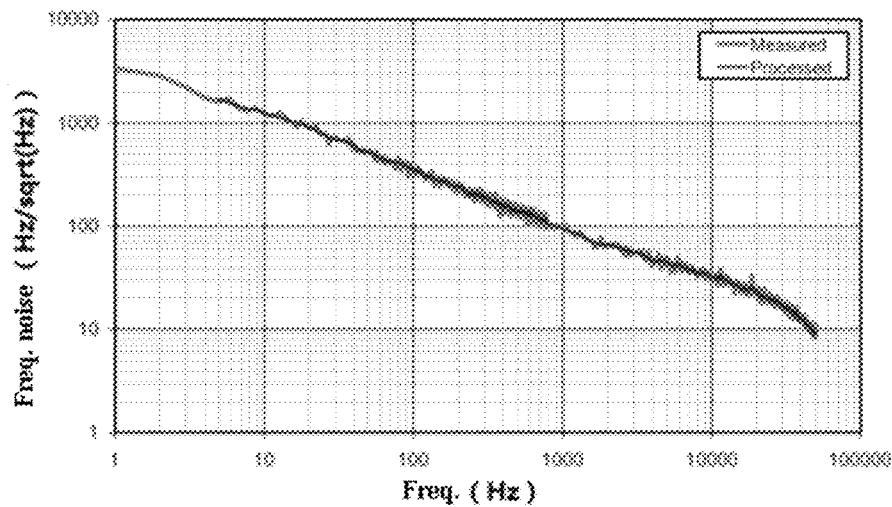
FIG. 8 is a diagram showing results of laser frequency noise spectrum.

In the present disclosure, a free-space external cavity structure is used, and the effective cavity length of the laser is increased as much as possible under the satisfaction of volume requirement of the device itself. Further, two principles are followed in the design of the frequency selective element, the etalon 3 and the DWDM optical filter 4 in the present disclosure, one is the insertion loss as small as possible and the other is a suitably narrow bandwidth, on one hand, small insertion loss is conducive to reduce a threshold of the laser, thus narrowing the linewidth, on the other hand, narrowing the bandwidth may effectively suppress the oscillation of the side mode and achieve the purpose of reducing noise. For example, the result of linewidth test of the narrow linewidth laser designed in the present disclosure is shown in FIG. 7 and the result of noise test is shown in FIG. 8.

Figure 9:
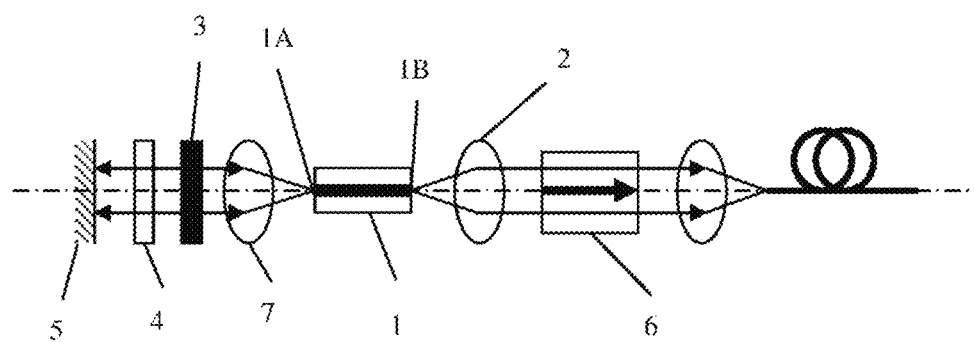
FIG. 9 is a schematic diagram of an optical path of the second embodiment of the structure of the present disclosure.

FIG. 9 illustrates the second embodiment of the narrow linewidth external cavity semiconductor laser structure provided by the present disclosure. As illustrated, the external cavity part and the coupling output part are respectively arranged on two sides of the semiconductor amplifier chip 1, and the rear end face (i.e. external cavity end) 1A of the semiconductor amplifier chip 1 is plated with an antireflective film, and the front end face (i.e. output end) 1B is plated with a partial reflection film as an output cavity mirror. The etalon 3 and the bandpass optical filter 4 are disposed behind the external cavity collimating lens 7 as frequency selective elements, and the total reflection mirror 5 is used as a cavity mirror. The output part of the narrow linewidth laser of the present structure is consisted of an output lens 2, an isolator 6 and a tail fiber coupling system.

Although the present invention has been shown and described in detail with reference to a related specific embodiment, it will be understood by those skilled in the art that various changes in form and details may be made therein without departing from the spirit and scope of the invention. Such changes will fall within the scope of protection as claimed in the claims of the present invention.

What is claimed is:

1. A narrow linewidth external cavity semiconductor laser comprising a semiconductor optical amplifier chip, a single-wavelength narrowband optical filtering assembly, a reflection mirror and a collimated light beam coupling output assembly;
    the semiconductor optical amplifier chip providing a sufficient gain as a gain medium so as to achieve laser output;
    the reflection mirror and one end face of the semiconductor optical amplifier chip forming two cavity mirrors of a laser resonant cavity; and
    the single-wavelength narrowband optical filtering assembly being disposed between the two cavity mirrors, which enables the laser to perform single-mode lasing and effectively restrain any other mode lasing,
    wherein the single-wavelength narrowband optical filtering assembly comprises a comb-shaped optical filter and a Gaussian type or flat-topped type of bandpass optical filter,
    wherein a transmission peak of the bandpass optical filter is aligned with a selected transmission peak of the comb-shaped optical filter, and no other transmission peaks of the comb-shaped optical filter is appear within a bandwidth of the bandpass optical filter.

2. The narrow linewidth external cavity semiconductor laser of claim 1, wherein the collimated light beam coupling output assembly comprises an isolator, a coupling lens and an output optical fiber.

3. The narrow linewidth external cavity semiconductor laser of claim 1, wherein the comb-shaped optical filter is an etalon, or a microring, or any other element which may produce an effect of the comb-shaped optical filter, and the bandpass optical filter is a DWDM optical filter, or an AWG, or an optical filter which may produce an effect of a bandpass optical filter.

4. The narrow linewidth external cavity semiconductor laser of claim 2, wherein the reflection mirror is a partial reflection mirror, and the single-wavelength narrowband optical filtering assembly, the partial reflection mirror and the collimated light beam coupling output assembly are located on the same side of the semiconductor optical amplifier chip and are connected in sequence.

5. The narrow linewidth external cavity semiconductor laser of claim 4, wherein a front end face of the semiconductor optical amplifier chip is plated with an antireflection film, and a rear end face is plated with a high-reflection film; an optical signal output by the semiconductor optical amplifier chip enters the comb-shaped optical filter after collimated to form a comb-shaped optical spectrum, and passes through the bandpass optical filter to select an optical signal with a desired wavelength, then a portion of light is reflected by the partial reflection mirror back to the semiconductor optical amplifier to form a laser feedback resonance, while the other portion of the light is transmitted and output from the partial reflection mirror, and passes through the isolator, the coupling lens and the output optical fiber and forms an output laser beam.

6. The narrow linewidth external cavity semiconductor laser of claim 2, wherein the reflection mirror is a total reflection mirror, and the single-wavelength narrowband optical filtering assembly and the total reflection mirror as well as the collimated light beam coupling output assembly are located on different sides of the semiconductor optical amplifier chip.

7. The narrow linewidth external cavity semiconductor laser of claim 6, wherein a rear end face of the semiconductor optical amplifier chip is plated with an antireflective film, and a front end face is plated with a partial reflection film; an optical signal output by the semiconductor optical amplifier chip enters the comb-shaped optical filter after collimated to form a comb-shaped optical filtering spectrum, and passes through the bandpass optical filter and selects an optical signal with a desired wavelength, and then, it is reflected by the total reflection mirror back to the semiconductor optical amplifier to form a laser feedback resonance, while the other portion of the optical signal is transmitted and output from the front end face of the semiconductor optical amplifier chip, and enters the isolator, the coupling lens and the output optical fiber after collimated to form an output laser beam.

8. The narrow linewidth external cavity semiconductor laser of claim 1, wherein the semiconductor optical amplifier chip, the single-wavelength narrowband optical filtering assembly, the reflection mirror, and the collimated light beam coupling output assembly are carried on a rigid plate which also has a temperature control system.

9. The narrow linewidth external cavity semiconductor laser of claim 8, characterized in that the relative position of a longitudinal mode over the whole filtering band is controlled by adjusting temperature of the laser through the temperature control system, so that output wavelength and power of the laser are controlled to enable the laser be in the best working state.

\* \* \* \* \*